United States Patent [19]

Lewis

[11] 4,433,252

[45] Feb. 21, 1984

[54] INPUT SIGNAL RESPONSIVE PULSE GENERATING AND BIASING CIRCUIT FOR INTEGRATED CIRCUITS

[75] Inventor: Scott C. Lewis, Essex Junction, Vt.

[73] Assignee: International Business Machines Corporation, Armonk, N.Y.

[21] Appl. No.: 340,438

[22] Filed: Jan. 18, 1982

[51] Int. Cl.³ .................. H03K 5/135; H03K 17/284; H03L 1/00
[52] U.S. Cl. ..................................... 307/269; 307/262; 307/297; 307/594; 307/597; 307/602; 365/233
[58] Field of Search .................. 307/269, 262, 296 R, 307/597, 297, 491, 594, 595, 601, 602; 365/226, 233

[56] References Cited

U.S. PATENT DOCUMENTS

| | | | |
|---|---|---|---|
| 3,508,084 | 4/1970 | Warner, Jr. | 307/304 |
| 3,757,200 | 9/1973 | Cohen | 323/8 |
| 3,778,784 | 12/1973 | Karp et al. | 307/262 X |
| 3,906,464 | 9/1975 | Lattin | 307/269 X |
| 3,959,781 | 5/1976 | Mehta et al. | 307/269 X |
| 3,961,269 | 6/1976 | Alvarez, Jr. | 307/262 X |
| 3,970,875 | 7/1976 | Leehan | 307/304 |
| 4,008,406 | 2/1977 | Kawagoe | 307/304 |
| 4,016,434 | 4/1977 | DeFilippi | 307/297 |
| 4,239,991 | 12/1980 | Hong et al. | 307/601 X |

OTHER PUBLICATIONS

Bula et al., "On-Chip Clock Generator"; *IBM Tech. Discl. Bull.*; vol. 21, No. 2, pp. 734-737; 7/1978.
Erickson, "Automatic Skew Compensator for LSI Clock Circuits"; *IBM Tech. Discl. Bull.*; vol. 21, No. 7, pp. 2998-2999; 12/1978.
Askin et al., "FET Device Parameters Compensation Circuit", IBM Tech. Discl. Bull., vol. 14, No. 7, pp. 2088-2089, Dec. 1971.
Grunberg et al., "A Bias Circuit Compensated for Threshold and Supply Variations", IBM Tech. Discl. Bull., vol. 16, No. 1, pp. 25-26, Jun. 1973.
Kruggel, "High-Performance Enhancement Mode FET Logic", IBM Tech. Discl. Bull., vol. 17, No. 8, p. 2230, Jan. 1975.

*Primary Examiner*—Larry N. Anagnos
*Attorney, Agent, or Firm*—Howard J. Walter, Jr.

[57] ABSTRACT

A signal generating circuit for an integrated circuit device responsive to first and second externally applied input signals occurring at a predetermined time interval in which the performance of a first input signal responsive circuit is made to vary inversely with respect to the performance of other internal signal generating circuits such that internally generated signals will occur at a predetermined time with respect to the external input signals regardless of the influence of variable parameters. Power dissipation of the first input signal responsive circuit also varies inversely with respect to that of other circuits present on the integrated circuit device so that total power dissipation is minimized.

14 Claims, 6 Drawing Figures

INPUT SIGNAL RESPONSIVE PULSE GENERATING AND BIASING CIRCUIT FOR INTEGRATED CIRCUITS

BACKGROUND OF THE INVENTION

1. Field of the Invention

This invention relates to pulse responsive input circuits for integrated circuit devices and particularly to circuits for generating internal timing signals which are intended to have a predetermined timing relationship with respect to externally controlled timing intervals.

2. Prior Art

Integrated circuit devices are subject to a great many parametric variables, both as a result of differing processing parameters and operating environment parameters. These variables cause circuit performance to vary considerably, making design of the circuits difficult, particularly when the designed circuit is intended to share a common interface with one or more additional integrated circuits. Designers have provided many techniques and circuits which are intended to compensate for variable parameters such that the operation of the integrated circuit device can be guaranteed to remain within specified limits, provided the integrated circuit is operated under conditions identified in a product specification.

IGFET integrated circuits are particularly sensitive to a number of different variable parameters which are determined to a large extent on variables present during their manufacture. A number of techniques are known which are intended to compensate for these variable parameters such as threshold voltage, diffusion resistance, physical dimensions and other variables. For example, the article, "FET Device Parameters Compensation Circuit" by H. O. Askin et al, IBM Technical Disclosure Bulletin, Vol. 14, No. 7, December 1971, pp. 2088-2089, teaches a biasing circuit for generating the gate voltage of the load device of an IGFET inverter in which a series of diode-connected IGFETs are used to clamp the load gate voltage to a voltage equal to a predetermined number of threshold voltage drops above ground. This circuit tends to minimize the effect that variable supply voltage and device parameters have on the load device current and power dissipation. F. Grunberg et al in their article, "A Bias Circuit Compensated for Threshold and Supply Variations", IBM Technical Disclosure Bulletin, Vol. 16, No. 1, June 1973, pp. 25-26, teach a similar circuit in which the load gate bias voltage is equal to an on-chip generated reference voltage plus a fixed number of threshold voltage drops. R. H. Kruggel in his article "High-Performance Enhancement Mode FET Logic", IBM Technical Disclosure Bulletin, Vol. 17, No. 8, January 1975, p. 2230, teaches a similar circuit using an external reference voltage to bias a bootstrap driver circuit in which the gate drive voltage (Vg-Vt) of the load device equals the reference voltage.

Another approach to compensating load gate biasing voltage in response to supply voltage variations is taught in U.S. Pat. No. 3,757,200 to Cohen. Here a negative feedback circuit including a pair of inverting amplifiers is used to limit the expected increase in current and power dissipation in the driver circuit in response to changes in supply voltages.

In each of the above references, the primary objective is to stabilize the load gate voltage by providing off-setting compensation when parameter changes tend to raise or lower the load gate bias voltage. In the following references, various techniques are used which tend to over compensate the load gate bias voltage such that the current of the load devices is stabilized.

U.S. Pat. No. 3,508,084 to Warner, Jr. is of interest as it teaches circuits for achieving various biasing effects for IGFET devices, including circuits for providing current and/or voltage regulation. FIGS. 14 and 17 of that patent describe circuits in which a negative resistance effect is achieved in an IGFET connected across a variable source of drain to source voltage. A decreasing load gate bias voltage is provided through the use of a voltage divider including a small, high impedance, pull-up device and a large, low impedance, pull down device having its gate electrode coupled to a chain of diode-coupled devices such that the large device becomes conductive after the supply voltage threshold voltage drops. The proportional increase in current of the large device with respect to the substantially constant current of the small device causes the gate voltage to decrease quickly once the large device begins to conduct.

U.S. Pat. No. 4,008,406 to Kawagoe is of interest as it teaches the use of a negative resistance circuit, similar to FIG. 14 of Warner, Jr., in which the load gate bias voltage for an inverter circuit is provided by a pull up resistor and a supply voltage responsive pull-down device for the purposes of reducing the over-compensation of the load gate bias voltage, in response to changes in the supply voltage, such that the generated bias voltage is more nearly constant.

U.S. Pat. No. 3,970,875 to Leehan is of interest as it teaches a load gate bias compensation circuit in which device parameters and supply voltage variations are compensated for by the use of a circuit in which an increasing proportion of the gate bias signal is applied to the inverting input terminal of a differential amplifier circuit. When the generated gate bias signal is increased above a reference voltage generated by an on-chip voltage divider, a portion of the increase is feedback to generate a new gate bias voltage less than the original increased voltage. Since the reference voltage will increase with increasing supply voltage a net attenuated increase in the gate bias voltage will be experienced by a corresponding increase in supply voltage, such that the gate voltage tends to stabilize at a voltage equal to the reference voltage. Since the reference voltage increases with increasing supply voltage, the gate bias voltage will also increase.

U.S. Pat. No. 4,016,434 to De Filippi is also of interest as it teaches another load gate biasing circuit using an inverting amplifier, similar to that of Leehan. Although De Filippi recognizes that it is desireable to compensate for increasing drain supply voltage by decreasing the magnitude of the load gate bias voltage, insufficient information is provided to determine the intended effect on load device current or load device power dissipation. In addition, the circuit requires that the load devices be driven in their linear mode of operation such that load device current and power dissipation are a function of drain supply voltage. The circuit also requires an additional external power supply for which no compensation is described. Thus, although increases in supply voltages will be compensated for by a decrease in gate bias voltage, no suggestion is made as to the net effect on either load device current or power dissipation.

Although the prior art teaches various techniques to compensate for both device parameter and supply voltage variations, the intended results of such techniques have previously been to provide compensation in such a manner as to essentially stabilize the circuit to be substantially insensitive to various parameter changes so that various characteristics such as circuit performance and power dissipation are limited to minimum ranges.

SUMMARY OF THE INVENTION

According to this invention, integrated circuits, particularly those associated with externally applied timing signals, are provided with a load gate biasing circuit in which characteristics such as circuit performance, or switching speed, and power dissipation are changed over the permitted operating ranges of both device parameter and supply voltage variations. This controlled change in performance and power dissipation is exhibited only by certain input signal responsive circuits and serves to compensate for corresponding changes in performance and power dissipation exhibited by certain additional circuits which are not so compensated. The net result is an input signal responsive integrated circuit which is stabilized in its overall performance and, to a great extent in its power dissipation, over the permitted ranges of device parameters and supply voltages specificed in a product description.

The invention is particularly useful in operating integrated circuits in which both external and internal timing signal intervals effect the optimum operation of the circuit in a system or application environment. A particular application is made in an integrated circuit memory chip in which an externally controlled chip select signal initiates a series of internal timing signals, at least some of which bear a critical timing relationship to at least one additional external timing signal.

The invention is implemented by causinq the performance of certain external responsive circuits to decrease during changes in operating conditions which cause the performance of certain internal signal generating circuits to be increased. The net result is that the overall performance of the internal and external signal responsive circuits is stabilized, thus a plurality of external timing signals having a specified timing interval can be accomodated by the integrated circuit without the necessity of providing an internal safety margin within the timing of the integrated circuit design parameters. The net effect results in reduced response and operating time of the integrated circuit. In addition, the power dissipated by the external signal responsive circuits, normally a substantial proportion of the standby power required by the integrated circuit, is reduced over the worst to best case operating conditions under which the circuit will be operated. This reduction in power dissipation tends to compensate for increased power dissipation experienced by other circuits either present on the same integrated circuit or on other integrated circuit chips in the system, such that the net power dissipation in the system tends to be stabilized.

A particular implementation of the invention is provided by the use of a load gate bias circuit for providing a gate bias voltage to control the performance and power dissipation of a chip input signal inverting buffer circuit which initiates a series of internal timing signals. As the operating conditions of the integrated circuit chip cause the internal circuits to increase in performance and power dissipation, the gate bias circuit causes the input buffer circuit to decrease in performance and power dissipation such that internally generated timing signals may be more easily coordinated with fixed-interval external timing intervals.

The invention has particular application to memory circuit devices in which an externally provided chip selection pulse is applied to a device followed by the application of valid data to be input to the memory after an externally determined time interval regardless of whether the operating conditions on the chip cause the chip to operate faster or slower than a designated nominal design condition.

These and other features of the invention will be apparent from the more particular description of the preferred embodiment of the invention, as illustrated in the accompanying drawings.

DESCRIPTION OF THE PREFERRED EMBODIMENT

In the use and application of integrated circuit devices, particularly that of memory chips, the time required to apply chip selection signals and obtain a desired read or write response, known as access time, is extremely important and can be influenced by a large number of variable parameters, such as operating temperature, supply voltages and device physical and electrical parameters. Since these parameters are extremely difficult and/or expensive to control, integrated circuit devices are given a set of operating specifications which define the circuit characteristics, including access time, under certain ranges of parameters, some of which, such as device parameters, must be met during the manufacturing of the devices and others, such as operating temperature and supply voltage ranges, must be met by the system in which the integrated circuit is used.

Integrated circuit chips designed for memory application normally include an active and a standby state in order to reduce overall system power consumption. In order to initiate a memory cycle, one or more memory chips must be selected and transferred from the standby state to the active state. The time required to initiate the active state becomes an inherent part of the access cycle. The memory chip designer would prefer to specify that all required information, such as memory addresses and data to be used in performing an access cycle, be valid at the time the chip is selected in order to reduce the specified chip access time. This, however, places a burden on the system designer to meet such a requirement and effectively requires a longer access time at the system level, thus eliminating any benefit obtained by minimizing the chip access time. Shorter system access times can be achieved by allowing the system to provide a chip selection signal to a memory chip at a predetermined time prior to the making of address or other required input data available to the memory chip. This creates a problem for the circuit designer in providing a circuit which under worst case, or slower performance and best case, or faster performance, will be able to initiate an access cycle and provide required internal timing signals which enable acceptance of valid address or data information at an externally determined time interval after the initiation of an access cycle.

Figure 1:
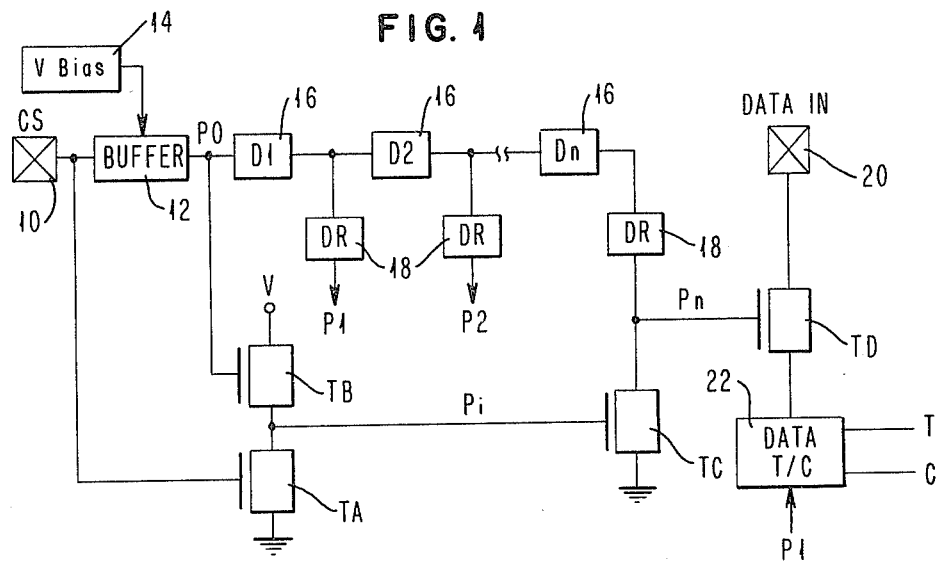
FIG. 1 is a schematic representation of a portion of an input signal responsive timing chain of an integrated circuit chip and illustrates the relationship between the chip select signal, the data input signals and the internal timing pulse generating circuits.
Figure 2:
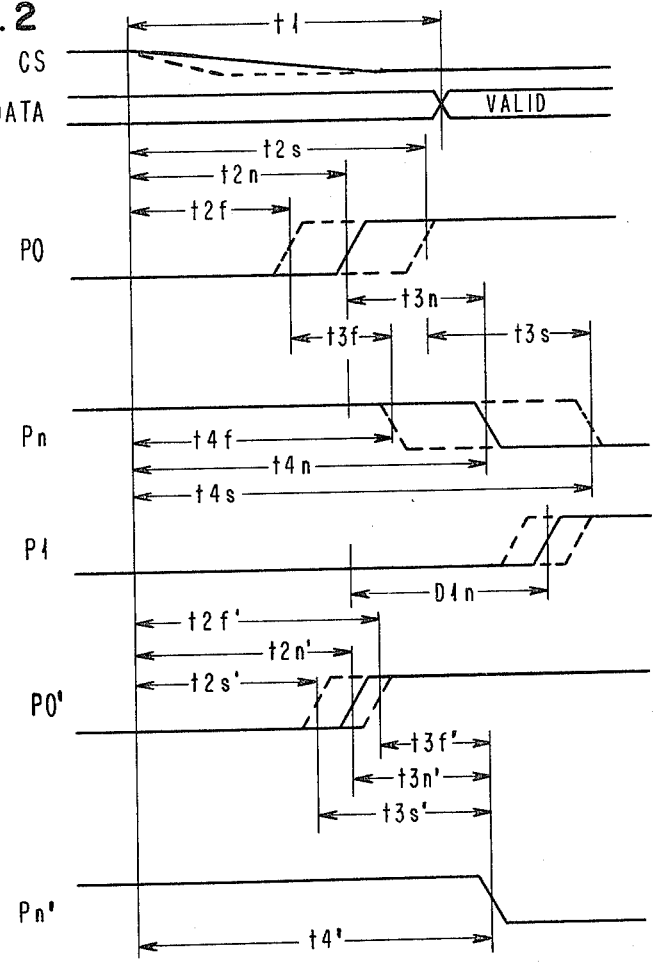
FIG. 2 is a pulse program illustrating the timing relationship between various external and internal timing signals under different operating environments.

FIGS. 1 and 2 illustrate this problem by way of a specific example. Shown in FIG. 1 is a schematic block diagram of the chip select and data, or address, inputs and an intervening timing chain used to control internal timing signals. A chip select input signal CS is applied to CS input pad 10 when the host system discharges CS from a high standby level to a low level. This transition, which can vary from a few nanoseconds to over 20 nanoseconds, is sensed by input buffer 12, which generates a low to high level pulse PO. Pulse PO is propagated through a series of delay circuits 16 and driver circuits 18 to produce a series of internal timing signals P1, P2 . . . Pn which are used to control the various memory functions necessary to implement an access cycle.

One of the first functions to be performed by the memory chip is to accept valid data placed on the data in input pad 20 a fixed time interval t1 after chip select CS is made valid by the system. Data is applied to a data latch or data true/complement generator 22 through a gating transistor TD. Input signals are acceptable only when internal timing signal Pn is at its active or high level. In order to reduce the chip access time, the timing signal is maintained in its high state at the end of each access cycle. In order for data present on input pad 20 to be accepted by the memory chip internal signal Pn must fall to its low level only after the data has become valid, after the time CS+t1, and before internal signal P1 becomes high at which time the state of the DATA T/C latch 22 is set. None of which can occur until after chip select CS becomes low. Internal timing signal Pn is discharged by transistor TC in response to the rising internal signal Pi. Pi rises in response to internal signal PO turning on transistor TB. Pi is also maintained at its low level whenever chip select CS is inactive by transistor TA. The timing relationship of the various external and internal signals is illustrated in FIG. 2. The correct sequence of operations is illustrated by the solid lines in FIG. 2 representing the "nominal" operating characteristics of the input control circuit. Here the term "nominal" identifies the operation of the circuit at nominal processing and operating conditions, as opposed to those conditions known as "worst" case and "best" case which define the previously identified minimum and maximum values of variable parameters permitted by the device specification.

As shown in FIG. 2, the nominal rise time of internal pulse PO occurs at time t2n after the initiation of the cycle when input chip select CS begins to fall. After a delay t3n, input gating signal Pn falls providing a time interval between the initiation of CS active and the falling of Pn equal to t4n, which, as intended, is longer than the externally controlled time interval t1 between the initiation of CS active and data VALID. After time t4n, the address or other data signal present on input pad 20 is isolated at the input to latch 22. Internal signal P1 follows signal PO by a delay interval D1n which sets latch 22. Latch 22 may, for example, be identical to the memory input signal buffer circuit described in U.S. Pat. No. 4,038,567, issued July 26, 1977, to S. C. Lewis et al.

The actual operation of the circuit under worst and best case conditions, however, presents a timing problem which must be accounted for in order for the circuit to operate properly. Under worst case conditions, such as are present when device threshold voltages are at their highest permitted level, supply voltage is at its lowest permitted levels and the fall time of chip select CS is slowest, the circuits will respond considerably slower than under nominal conditions. Thus the time between the external initiation of CS active and the occurrence of PO becomes t2s. Accordingly, internal signal Pn is also delayed by t3s after PO, such that interval t4S is considerably longer than externally controlled interval t1. Because the signal propagation paths for signals Pn and P1 are different, it is possible for signal P1 to rise before data is isolated at the input to latch 22. The large capacitance associated with lines connecting data input pad 20 to external circuits will prevent the latch 22 from properly setting the required voltage levels to convert the relatively low level input data signals to the relatively high level signals required for proper operation of the memory chip.

If, on the other hand, the memory chip is operating under best case conditions, that is low threshold voltage, high supply voltage and fast transition of input CS, then the sequence of events is speeded up with respect to nominal conditions. Both PO and Pn operate faster than nominal as represented by time intervals t2f and t3f to cause signal Pn to discharge before data becomes valid at interval t1. Because the information at input pad 20 is not valid when it was isolated, invalid data is presented to latch 22.

The above problems can easily be prevented by increasing the chip access time such that time interval t4f never occurs prior to external time t1 and that time interval D1 plus t2s is always longer than interval t4s. Such a solution would require a considerable increase in access time.

The present invention provides a solution which requires no increase in access time as follows. A load gate bias circuit 14, in FIG. 1 is coupled to the load device in input buffer circuit 12 such that the time interval required to generate internal signal PO is shortest under worse case or slow operating conditions and is longest under best case operating conditions. As illustrated by pulse PO' in FIG. 2, the time interval t2S' between the initiation of external chip select CS active and the rise time of PO' becomes shorter than that in the nominal case and the interval t2f becomes longer than the nominal case. Since the remainder of the circuits still operate slower under worst case conditions the time interval t4' between CS active and Pn' remains substantially constant throughout the entire range of permissible operating conditions.

Figure 3:
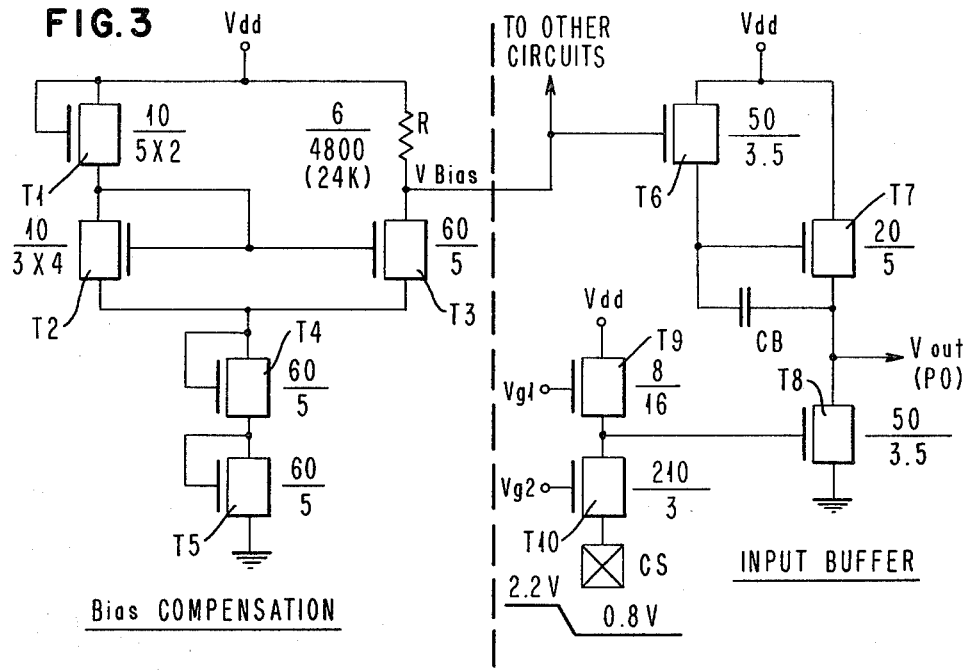
FIG. 3 is a circuit schematic of the load gate bias compensation circuit of the invention and an input buffer circuit.

Control of the performance of the input buffer circuit 12 is accomplished by the circuit shown in FIG. 3 in which transistors T1–T5 and resistor R provide the load gate bias voltage VBias to the input buffer circuit represented by transistors T6–T10. For the specific application shown, the major variable parameter limits include drain supply voltage Vdd equal to 8.5 volts ±10% and threshold voltages ranging from a low of about 1.15 volts to a high of about 1.60 volts. Device sizes are indicated as a fraction placed adjacent to each device indicating channel width over channel length in micrometers or microns. The compound denominator shown for devices T1 and T2 represent that a specified number of transistors having the specified channel width are serially connected, for example the W/L of device T1 is represented as 10/5×2 and is equivalent to two 10 micron wide devices having 5 micron channel lengths connected in series. Device T2 represents four serially connected devices having a W/L equal to 10/3. Resistor R is designated in a similar manner and represents a diffused line having a width equal to 6 microns, the total resistance being about 24,000 ohms.

The bias compensation circuit includes on-chip diffused resistor R coupled between drain supply voltage source Vdd and output VBias. Coupled between VBias and the circuit ground are three relatively large width and short length serially connected transistors T3, T4 and T5, each having a W/L equal to 60/5. T4 and T5 are diode-connected with their gate electrodes coupled to their drain electrodes to operate in their saturation mode. T1 and T2 are relatively small devices and are serially connected between Vdd and the common source or reference voltage node between T3 and T4. Both T1 and T2 are diode connected to act as a voltage divider to apply a portion of Vdd less the voltage on the source of T2 and T3 to the gate of T3. When the supply voltage Vdd is constrained to operate above four threshold voltage drops T3 is more or less conductive depending upon the voltages on its gate and source electrodes, as determined by the level of Vdd, device threshold voltages and other parameters. The extent to which T3 is biased into conduction determines its drain current and thus the voltage drop across resistor R.

Figure 4:
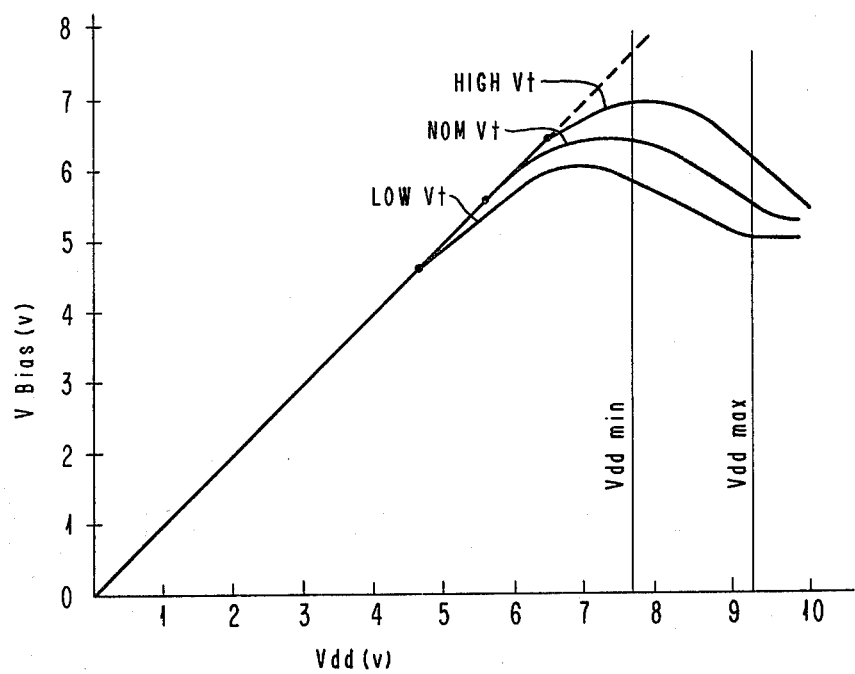
FIG. 4 is a graphical representation of the voltage generated by the bias compensation circuit versus the drain supply voltage under the range of device performance parameters and illustrates a decrease in gate bias voltage between high threshold, low performance circuits and low threshold, high performance circuits over the entire permissible range of drain supply voltages and a decrease in gate bias voltage between the lower performance, minimum drain supply voltage and the high performance, maximum drain supply voltage.

FIG. 4 illustrates the output voltage VBias as a function of supply voltage Vdd at three different threshold voltages, a nominal threshold process, a high threshold process and a low threshold process. VBias decreases for each of the three threshold values over the entire range of the specification permitted range of Vdd, from Vdd minimum to Vdd maximum.

VBias is coupled to one or more input buffer circuits as shown in FIG. 3. The input buffer circuit includes devices T6–T10 and is intended to be responsive to TTL input signals applied to the chip select input pad CS to provide an output signal Vout. Transistors T7 and T8 form a bootstrapped inverter circuit. Transistors T9 and T10 having their gates coupled to biasing voltages Vg1 and Vg2 provide isolation between the input and the gate of T8 as is well known in the prior art. See for example the article "Threshold Independent Chip Select Input Circuit", by S. C. Lewis, IBM Technical Disclosure Bulletin, Vol. 23, No. 8, January 1981, pp. 3608–3609.

Figure 5:
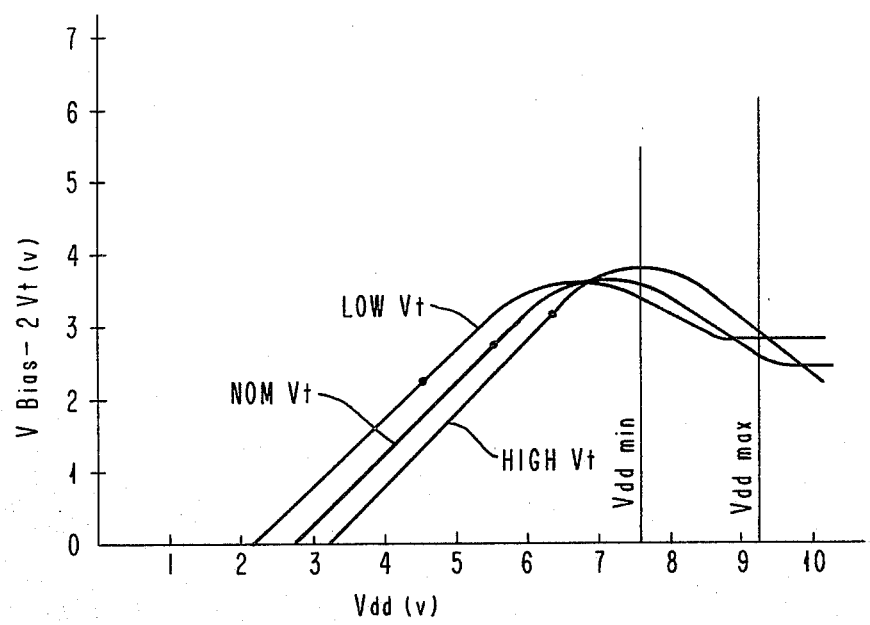
FIG. 5 is a graphical representation of the actual gate drive voltage applied to the load device in the inverter buffer circuit of FIG. 3 versus the drain supply voltage and illustrates the decrease in gate drive voltage under both increasing device threshold voltage over the range of minimum to maximum drain supply voltage, thus providing lower performance and power dissipation in the input buffer circuit while additional circuits will exhibit increased performance and power dissipation.

In the standby or unselected state, the TTL input is at its high level, in excess of 2.2 volts. This input signal exceeds the threshold voltage of T8 such that T8 is highly conductive keeping output Vout very close to ground or zero volts. Driver device T7 has its gate biased to VBias less the threshold voltage of T6 which acts as a bootstrap precharge device and has its gate connected to VBias. During standby periods, both T7 and T8 are conductive, resulting in power dissipation, which equals the drain current of T7 times the supply voltage Vdd, assuming that T8 maintains Vout very near zero volts. The drain current of T7 is a function of the gate drive Vg7 less the threshold voltage of T7, which is equivalent to VBias minus the threshold voltages of T6 and T7, or about equal to VBias-2Vt. FIG. 5 shows the value of the gate drive on T7, VBias-2Vt, for devices having various threshold voltages over a range of supply voltages and illustrates that the gate drive decreases over the increasing range of Vdd between Vdd minimum and Vdd maximum. The gate drive being slightly lower for low threshold devices than that for high threshold devices.

When input signal CS is selected, it falls from its minimum high level of 2.2 volts to a maximum low level of 0.8 volts as shown in FIG. 3. This causes T8 to turn off allowing driver T7 to charge the output node Vout to Vdd with the aid of bootstrap capacitor CB. The performance of the buffer is determined by the transition time t for the output Vout to be charged from its initial zero volts to Vdd and is defined as $t = Cout \times Vout/Id7$, where Cout is the parasitic output capacitance of node Vout, Vout is the output voltage difference Vdd-0 volts and Id7 is the drain current of T7. Device T7 will be in its saturation mode, since Vgs-Vt is always less than Vds, and the drain current of T7 is a function of $(VBias-2Vt)^2$. The transition time t then is a function of $Vdd/(VBias-2Vt)^2$ and varies under worst case conditions, i.e. minimum Vdd and maximum threshold voltage Vt, to best case conditions i.e. maximum Vdd and minimum threshold voltage Vt, by the ratio 0.53/1.2, based on values of VBias-2Vt and Vdd taken from FIG. 5. That is, the buffer circuit provides a full level Vdd output under best case conditions in a time which is about twice that obtained under worst case conditions. Circuits in the remainder of the integrated circuit chip without a compensated load gate bias circuit would be expected to provide a decrease in transition time t by about 30% under the same conditions between worst case and best case conditions.

Referring to FIG. 2, it will be seen that when the circuits of the integrated circuit are operating under best case or fast conditions, the internal delay between PO' and Pn' will be t3f'. However, with the bias compensation circuit of the invention, the delay t2f' under best case conditions is longer than nominal, such that the total time t4' between input CS and Pn' is the proper duration enabling Pn' to occur after externally controlled time t1. A similar but inverse timing situation occurs when the internal circuits operate under worst case or slow conditions, as PO' occurs at an earlier time to allow the increased delay between PO' and Pn' to be compensated. Note that under both compensated and uncompensated conditions the internal delays t3f, t3n and t3s are equal to t3f', t3n' and t3s', respectively, as only the input buffer circuit timing has been altered.

Figure 6:
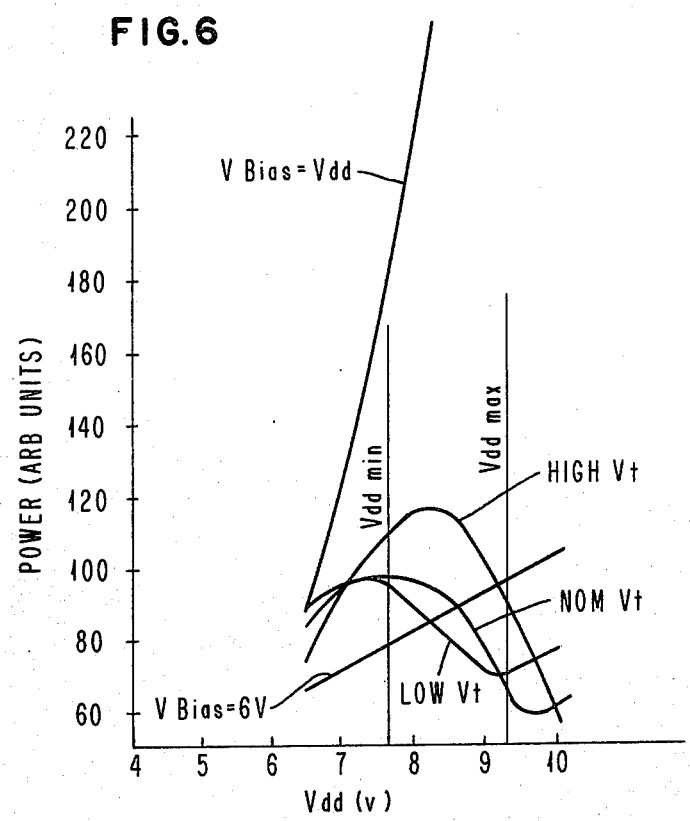
FIG. 6 is a graphical representation of the relative changes in power dissipation exhibited by the load device of an input buffer circuit versus the drain supply voltage for a number of different load gate biasing techniques and illustrates the relative decrease in power dissipation between minimum and maximum drain supply voltage exhibited by the invention compared to the significant increases in power dissipation exhibited by two prior art techniques.

Another beneficial aspect of the invention is that the power dissipated by the input buffer circuit is reduced under conditions of increasing supply voltage and decreasing device threshold voltages, conditions under which the power dissipation would increase in an uncompensated buffer circuit. The power dissipated by devices T7 and T8 in the buffer circuit during standby is approximately equal to the drain current of device T7 times the voltage drop between Vdd and ground, or P=Id×Vdd. FIG. 6 illustrates the effective ranges of power dissipation of the buffer circuit of FIG. 3 using several different load gate bias techniques within the permissible operating range of drain supply voltage. Power, in arbitrary units, for the circuit of the invention is illustrated for low, high and nominal threshold voltage cases and can be seen to clearly decrease over the Vdd minimum to Vdd maximum operating range. Additional power dissipating circuits which may be present on the same integrated circuit chip will show an increase in power dissipation over the same range of Vdd. Thus, the total power dissipated by the integrated circuit chip will effectively be stabilized or reduced when the circuit of the invention is used. For comparative purposes, two additional commonly used biasing arrangements are also illustrated. In the case where the applied VBias is equal to Vdd, the power dissipation increases substantially exponentially as shown by the curve VBias=Vdd. In the case where BVias is equal to a fixed externally or internally generated reference voltage, assuming device threshold voltage and other parameter compensating techniques are used, the power increases linearly as indicated by the curve VBias=6 V. In both of the last two cases, the power dissipated increases over the operating range of Vdd such that the total power dissipated by the integrated circuit will unconditionally increase as well.

The device sizes used in the bias compensation circuit of FIG. 3 are such that virtually all processing parameter variables are compensated for such that changes in parameters caused by processing variations do not cause VBias to vary when Vdd is fixed. For example, the channel width W of serially connected devices T3, T4 and T5 is chosen to be substantially equal to the effective width of diffused resistor R. When the processing parameter diffusion width increases the resistance of diffused resistor R decreases. However, the width of the serially connected devices will also increase causing the W/L term in the drain current equation to increase, and thus the series current to increase, to compensate for the decrease in the resistance of R. In order to avoid the tendency of the circuit to over compensate VBias for devices exhibiting low threshold voltage, the sub-channel lengths of device T2 have been made short enough to make them sensitive to the short-channel effect which tends to cause a decrease in the effective threshold voltage, particularly when L is less than about 3.5 microns. The decrease in threshold voltage is more pronounced in the sub-devices of T2 than is those of T1 and enables short channel inducing process parameters to increase the current through T2 in order to reduce the gate voltage of device T3, thereby allowing VBias to increase. VBias then varies primarily as a function of Vdd in any one particular integrated circuit, as is desired. In turn, the actual parameter intended to be controlled, the gate drive voltage of device T7 (Vgs-Vt) or VBias-2Vt varies only with changes in the externally applied drain supply voltage Vdd.

While the invention has been particularly described in terms of a preferred IGFET embodiment, those skilled in the art will recognize that the invention may be used in other technologies such as bipolar devices.

What is claimed is:

1. A signal generating circuit for an integrated circuit device responsive to first and second externally applied input signals occurring at an externally determined time interval, including a first internal signal generating circuit responsive to the first external signal for generating a first internal signal, a second internal signal generating circuit responsive to the first internal signal for generating a second internal signal having a predetermined timing relationship with the second external input signal, the second internal signal generating circuit being responsive to variations in device and environmental parameters such that the time interval between the first and second internal signals is variable, wherein the first internal signal generating circuit is characterized by:

means for causing the time interval between the first input signal and the first internal signal to vary inversely as the time interval between the first internal signal and the second internal signal in response to the same parameters which cause the time interval between the first internal signal and the second internal signal to vary so that the occurrence of the second internal signal with respect to the second external input signal is substantially equal to the predetermined timing relationship.

2. The signal generating circuit of claim 1, wherein the means for causing the time interval between the first input signal and the first internal signal to vary includes a bias voltage generating circuit which causes the first internal signal generating circuit to delay generation of the first internal signal under conditions which cause the time interval between the first internal signal and the second internal signal to be decreased and which causes the first internal signal generating circuit to advance generation of the first internal signal under conditions which cause the time interval between the first internal signal and the second internal signal to be increased.

3. The signal generating circuit of claim 2, wherein the bias voltage generating circuit is coupled across the supply voltage source provided to the integrated circuit device for generating a bias voltage which varies inversely with the applied supply voltage source.

4. The signal generating circuit of claim 3, wherein the bias voltage has a maximum value when the supply voltage is at the minimum permissible value and a minimum value when the supply voltage is at the maximum permissible value.

5. The signal generating circuit of claim 4, wherein the bias voltage is coupled to the load device of a first external input responsive inverter circuit coupled across the supply voltage source.

6. The signal generating circuit of claim 5, wherein the bias voltage is generated at a circuit voltage node coupled by a load impedance to a drain supply voltage and through a first IGFET device to a reference voltage node, the reference voltage node being biased at a voltage having a magnitude greater than a source supply voltage, the gate electrode of the first IGFET being coupled to a voltage divider connected between the drain supply voltage and the reference voltage node.

7. The signal generating circuit of claim 6, wherein the load impedance comprises a resistor formed on the integrated circuit.

8. The signal generating circuit of claim 6, wherein the reference voltage node is serially coupled to the source supply voltage by one or more diode-connected IGFET devices, each device having its gate and drain electrode connected together.

9. The signal generating circuit of claim 6, wherein the voltage divider includes at least two serially connected, diode-connected IGFETs.

10. The signal generating circuit of claim 9, wherein the serially connected IGFETs in the voltage divider include a plurality of individual IGFETs having their channels connected in series between a common drain electrode and a common source electrode and having their gate electrodes connected to the common drain electrode.

11. The signal generating circuit of claim 1, wherein the power dissipated by the first internal signal generating circuit varies inversely with respect to variations in the supply voltage applied to the integrated circuit device, such that increased supply voltage causes a reduction in power dissipation.

12. The signal generating circuit of claim 11, wherein the integrated circuit operates in an active and a standby mode and where the first internal signal generating circuit dissipates substantially more power in the standby mode than in the active mode.

13. The signal generating circuit of claim 1 wherein the first external signal is a select signal initiating operation of a series of functions within the integrated circuit device.

14. The signal generating circuit of claim 13 wherein the second external signal represents the presence of variable information provided to the integrated circuit device.

* * * * *